(12) United States Patent
Tsuji et al.

(10) Patent No.: US 7,847,003 B2
(45) Date of Patent: Dec. 7, 2010

(54) POSITIVE TYPE PHOTOSENSITIVE RESIN COMPOSITION

(75) Inventors: Shinsuke Tsuji, Funabashi (JP); Yosuke Iinuma, Funabashi (JP); Shinya Arase, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 1290 days.

(21) Appl. No.: 10/565,977

(22) PCT Filed: Jul. 28, 2004

(86) PCT No.: PCT/JP2004/011103

§ 371 (c)(1),
(2), (4) Date: Jan. 26, 2006

(87) PCT Pub. No.: WO2005/010615

PCT Pub. Date: Feb. 3, 2005

(65) Prior Publication Data

US 2006/0211797 A1    Sep. 21, 2006

(30) Foreign Application Priority Data

Jul. 28, 2003    (JP)    ............... 2003-280625

(51) Int. Cl.
 C08K 5/13    (2006.01)
 G03F 7/23    (2006.01)
 G03F 7/30    (2006.01)

(52) U.S. Cl. ............... 524/324; 524/556; 430/191; 430/165; 430/192; 430/193

(58) Field of Classification Search ............... 524/324, 524/556; 430/165, 191, 192, 193
See application file for complete search history.

(56) References Cited

U.S. PATENT DOCUMENTS

| 6,593,043 B2 * | 7/2003 | Suwa et al. ............... 430/18 |
| 6,746,812 B2 * | 6/2004 | Watanabe et al. ......... 430/165 |
| 2005/0147914 A1 | 7/2005 | Hatanaka et al. |

FOREIGN PATENT DOCUMENTS

| CN | 1356356 A | | 7/2002 |
| CN | 1356356 A | * | 7/2002 |
| JP | 4-211254 | | 8/1992 |
| JP | 4-211255 | | 8/1992 |
| JP | 6-95386 | | 4/1994 |
| JP | 07-120925 | | 5/1995 |
| JP | 7-140648 | | 6/1995 |
| JP | 8-262709 | | 10/1996 |
| JP | 2001-242616 | | 9/2001 |
| JP | 2001-354822 | | 12/2001 |
| JP | 2003-195501 | | 7/2003 |
| JP | 2003195501 A | * | 7/2003 |

* cited by examiner

*Primary Examiner*—David Wu
*Assistant Examiner*—Michael M Bernshteyn
(74) *Attorney, Agent, or Firm*—Oblon, Spivak, McClelland, Maier & Neustadt, L.L.P.

(57) ABSTRACT

The present invention provides a positive photosensitive resin composition which can form a cured film excellent in process resistance such as heat resistance, solvent resistance or long-time baking resistance and transparency, and which is excellent in photosensitive properties such as resolution and sensitivity, and which has high storage stability and a wide process margin. Further, the present invention provides a positive photosensitive resin composition having such high reliability that no deterioration of electrical characteristics will be led in its application for liquid crystal display devices. A positive photosensitive resin composition characterized by comprising an alkali-soluble resin which is a copolymer essentially comprising an unsaturated carboxylic acid derivative and an N-substituted maleimide and which has a number average molecular weight of from 2,000 to 20,000, a 1,2-quinone diazide compound represented by the formula (1):

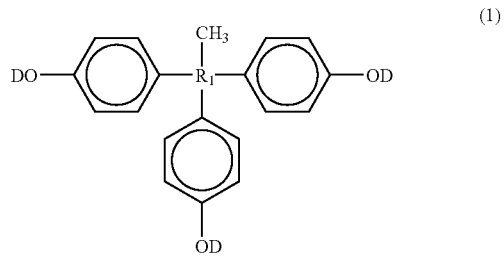

(wherein each of D independently is a hydrogen atom or an organic group having a 1,2-quinone diazide group, $R_1$ is a tetravalent organic group, provided that at least one of D is an organic group having a 1,2-quinone diazide group), and from 5 to 50 parts by weight, per the alkali-soluble resin, of a crosslinking compound represented by the formula (2):

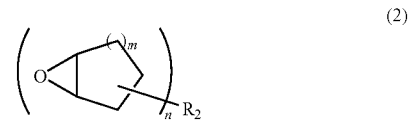

(wherein n is an integer of from 2 to 10, m is an integer of from 0 to 4, and $R_2$ is a n-valent organic group).

20 Claims, No Drawings

POSITIVE TYPE PHOTOSENSITIVE RESIN COMPOSITION

TECHNICAL FIELD

The present invention relates to a positive photosensitive resin composition. More particularly, the present invention relates to a positive photosensitive resin composition suitable for a display material.

BACKGROUND ART

Generally, display devices such as thin film transistor (TFT) liquid crystal display devices or organic EL devices have an electrode overcoating, a planarization film, an insulation film and the like forming a pattern. As materials to form such films, a photosensitive resin composition is widely used, which requires only a small number of process steps to form a desired pattern and has such a characteristic as a sufficient planarization property. Further, such films are required to have various properties including process resistance such as heat resistance, solvent resistance or long-time baking resistance, high transparency and adhesion to substrates.

Therefore, positive photosensitive resin compositions to form such films are required to give cured materials excellent in the above properties. Further, in addition, it is desired that the photosensitive resin compositions have good storage stability and a wide process margin so that patterns can be formed under various process conditions suitable for the particular purposes. Further, photosensitive properties such as resolution and sensitivity are also important. On the other hand, for the liquid crystal display devices, it is also essential to use materials having such high reliability that, for example, they will not contaminate liquid crystal.

Thus, various properties are required for photosensitive resin compositions for display materials. Therefore, with respect to respective properties of the photosensitive resin compositions, various studies have been conducted heretofore. For example, as one satisfying both high heat resistance and high transparency, a material having glycidyl groups in an alkali-soluble resin has been reported (JP-A-8-262709). On the other hand, as one realizing high sensitivity and high resolution, a material employing a 1,2-naphthoquinone diazide compound has been reported (JP-A-4-211255).

However, it is not necessarily easy to develop a photosensitive resin compound which can satisfy all of the above various properties, and a mere combination of prior arts has been hardly successful. Further, up to now, there has been no case that reports on a highly reliable material not to deteriorate electrical characteristics in its application for liquid crystal display devices.

DISCLOSURE OF THE INVENTION

It is an object of the present invention to provide a positive photosensitive resin composition which can form a cured film excellent in process resistance such as heat resistance, solvent resistance or long-time baking resistance and transparency, and which is excellent in photosensitive properties such as resolution and sensitivity, and has high storage stability and a wide process margin. More particularly, it is an object of the present invention to provide a positive photosensitive resin composition having such high reliability that no deterioration of electrical characteristics will be led in its application for liquid crystal display devices.

The object of the present invention is achieved by the following positive photosensitive resin composition.

1. A positive photosensitive resin composition characterized by comprising an alkali-soluble resin which is a copolymer essentially comprising an unsaturated carboxylic acid derivative and an N-substituted maleimide and which has a number average molecular weight of from 2,000 to 20,000, a 1,2-quinone diazide compound represented by the formula (1):

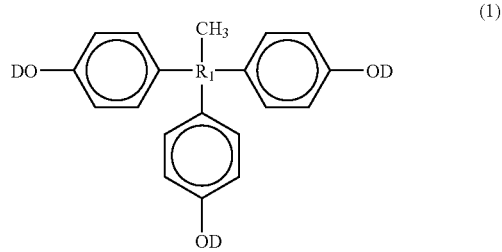

(wherein each D independently is a hydrogen atom or an organic group having a 1,2-quinone diazide group, $R_1$ is a tetravalent organic group, provided that at least one of D is an organic group having a 1,2-quinone diazide group), and from 5 to 50 parts by weight, per 100 parts by weight of the alkali-soluble resin, of a crosslinking compound represented by the formula (2):

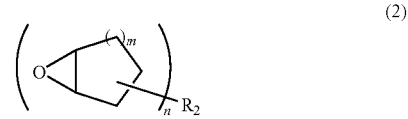

(wherein n is an integer of from 2 to 10, m is an integer of from 0 to 4, and $R_2$ is an n-valent organic group).

2. The positive photosensitive resin composition according to the above 1, wherein the residual monomer ratio in the alkali-soluble resin is at most 2.5 wt %.

3. The positive photosensitive resin composition according to the above 1 or 2, wherein the 1,2-quinone diazide compound is contained in an amount of from 5 to 100 parts by weight, per 100 parts by weight of the alkali-soluble resin.

4. The positive photosensitive resin composition according to the above 1, 2 or 3, wherein the 1,2-quinone diazide compound is a compound represented by the following formula (3):

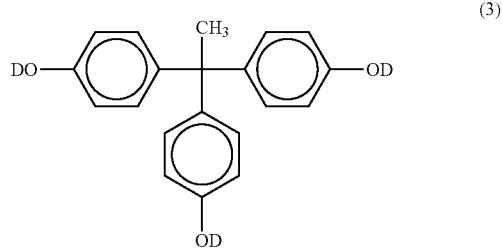

(wherein each D independently is a hydrogen atom or an organic group having a 1,2-quinone diazide group, provided that at least one of D is an organic group having a 1,2-quinone diazide group).

5. The positive photosensitive resin composition according to the above 1 or 3, wherein the 1,2-quinone diazide compound is a compound represented by the following formula (4):

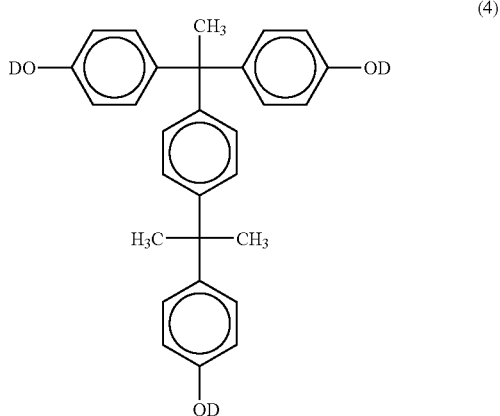

(wherein each D independently is a hydrogen atom or an organic group having a 1,2-quinone diazide group, provided that at least one of D is an organic group having a 1,2-quinone diazide group).

6. The positive photosensitive resin composition according to any one of the above 1 to 5, wherein the alkali-soluble resin has no epoxy group.

7. The positive photosensitive resin composition according to any one of the above 1 to 6, wherein the crosslinking compound is of the formula (2) wherein n is an integer of from 3 to 10, and m is an integer of 2.

8. The positive photosensitive resin composition according to any one of the above 1 to 7, which contains a surfactant in an amount of from 0.01 to 5 parts by weight per 100 parts by weight of the alkali-soluble resin.

9. The positive photosensitive resin composition according to any one of the above 1 to 8, wherein the positive photosensitive resin composition is a solution having a solid content concentration of from 1 to 50 wt %.

The present invention provides a positive photosensitive resin composition which can form a cured film excellent in process resistance such as heat resistance, solvent resistance or long-term baking resistance and transparency, and which is excellent in photosensitive properties such as resolution and sensitivity, and has high storage stability and a wide process margin. Further, the present invention provides a cured film having such high reliability that no deterioration of electrical characteristics will be led in its application for liquid crystal display devices.

BEST MODE FOR CARRYING OUT THE INVENTION

Now, the photosensitive resin composition of the present invention will be described in detail.

Alkali-soluble Resin

The alkali-soluble resin contained in the positive photosensitive resin composition of the present invention is a copolymer comprising an unsaturated carboxylic acid derivative and an N-substituted maleimide as essential components (hereinafter referred to as a specific copolymer), and its number average molecular weight is from 2,000 to 20,000.

The unsaturated carboxylic acid derivative constituting such a specific copolymer is not particularly limited, but as specific examples, methacrylic acid, alkyl methacrylates such as methyl methacrylate, ethyl methacrylate, n-butyl methacrylate, sec-butyl methacrylate and t-butyl methacrylate; acrylic acid, alkyl acrylates such as methyl acrylate and isopropyl acrylate; cycloalkyl methacrylates such as cyclohexyl methacrylate, 2-methylcyclohexyl methacrylate, dicyclopentanyloxyethyl methacrylate and isobornyl methacrlyate; cycloalkyl acrylates such as cyclohexyl acrylate, 2-methylcyclohexyl acrylate, dicyclopentanyloxyethyl acrylate and isobornyl acrylate; aryl methacrylates such as phenyl methacrylate and benzyl methacrylate; aryl acrylates such as phenyl acrylate and benzyl acrylate; dicarboxylates such as diethyl maleate, diethyl fumarate and diethyl itaconate; hydroxyalkyl esters such as 2-hydroxyethyl methacrylate, 2-hydroxypropyl methacrylate and 2-hydroxyethyl methacrylate; and bicyclo unsaturated compounds such as bicyclo[2.2.1]hept-2-ene, 5-methylbicyclo[2.2.1]hept-2-ene, 5-ethylbicyclo[2.2.1]hept-2-ene, 5-hydroxybicyclo[2.2.1]hept-2-ene, 5-carboxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo [2.2.1]hept-2-ene, 5-ethoxybicyclo[2.2.1]hept-2-ene, 5,6-dihydroxybicyclo[2.2.1]hept-2-ene, 5,6-dicarboxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo[2.2.1]hept-2-ene, 5-carboxy-5-methylbicyclo[2.2.1]hept-2-ene, 5-carboxy-5-ethylbicyclo[2.2.1]hept-2-ene, 5-hydroxymethyl-5-methylbicyclo[2.2.1]hept-2-ene, 5-carboxy-6-methylbicyclo[2.2.1]hept-2-ene, 5-carboxy-6-ethylbicyclo[2.2.1]hept-2-ene, 5,6-dicarboxybicyclo[2.2.1]hept-2-ene anhydride (himic anhydride), 5-t-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-di(t-butoxycarbonyl)bicyclo[2.2.1]hept-2-ene and 5,6-di(cyclohexyloxycarbonyl)bicyclo[2.2.1]hept-2-ene may be mentioned. Such unsaturated carboxylic acid derivatives may be used alone or in combination of two or more of them.

The ratio of the unsaturated carboxylic acid derivative in the specific copolymer is preferably from 10 to 99 wt %, more preferably from 30 to 95 wt %, most preferably from 60 to 80 wt %. If the ratio of the unsaturated carboxylic acid derivative is less than 10 wt %, the alkali solubility of the copolymer will be insufficient.

The N-substituted maleimide constituting the specific copolymer is not particularly limited. As specific examples, cyclohexylmaleimide, phenylmaleimide, methylmaleimide and ethylmaleimide may be mentioned. From the viewpoint of transparency, one having no aromatic ring is preferred, and from the viewpoint of developability, transparency and heat resistance, one having an alicyclic skeleton is more preferred. Among them, cyclohexylmaleimide is most preferred.

The ratio of the N-substituted maleimide in the specific copolymer is preferably from 1 to 90 wt %, more preferably from 5 to 50 wt %, most preferably from 20 to 40 wt %. If the N-substituted maleimide is less than 1 wt %, the copolymer will have a low Tg and will, therefore, be inferior in the heat resistance. If it exceeds 90 wt %, the transparency may sometimes deteriorate.

The components constituting the specific copolymer include an unsaturated carboxylic acid derivative and an N-substituted maleimide as essential components, and further, other copolymerizable ethylenic compounds may be added thereto. As specific examples of such ethylenic compounds, styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene and 2,3-dimethyl-1,3-butadiene may be mentioned. Such ethylenic compounds may be introduced for the purposes of adjusting the solubility or hydrophobicity and controlling the molecular weight of the specific copolymer.

In the specific copolymer, the ratio of such other ethylenic compounds is preferably at most 80 wt %, more preferably at most 50 wt %, further more preferably at most 20 wt %. If it is more than 80 wt %, the essential components relatively decrease, whereby it will be difficult to obtain the effect of the present invention sufficiently.

Preferably, the specific copolymers do not have functional groups by which they may be reacted each other, particularly preferably, they do not have epoxy groups. In the case where such specific copolymers have functional groups by which they may be reacted each other, there may be a case such that the storage stability of the viscosity of the solution of the composition and the sensitivity will deteriorate.

Thus, as an example of the most preferred ratio of the respective monomers constituting the specific copolymer, the unsaturated carboxylic acid derivative is from 60 to 80 wt %, and the N-substituted maleimide is from 20 to 40 wt %. Further, if other ethylenic compounds are contained in the specific copolymer, the unsaturated carboxylic acid derivative is from 60 to 80 wt %, the N-substituted maleimide is from 20 to 40 wt %, and such other ethylenic compounds are from 0.1 to 20 wt %.

The method for obtaining the specific copolymer to be used in the present invention is not particularly limited. The copolymer is usually produced by radical polymerization of the above-mentioned monomers in a polymerization solvent. Further, if necessary, the monomers may be polymerized in such a state that their functional groups are protected, and then deprotection may be carried out.

The polymerization solvent to be used for producing the specific copolymer may, for example, be an alcohol such as methanol, ethanol, propanol or butanol; an ether such as tetrahydrofuran or dioxane; an aromatic hydrocarbon such as benzene, toluene or xylene; a polar solvent such as N,N-dimethylformamide or N-methyl-2-pyrrolidone; an ester such as ethyl acetate, butyl acetate or ethyl lactate; an alkoxy ester such as methyl 3-methoxypropionate, methyl 2-methoxypropionate, ethyl 3-methoxypropionate, ethyl 2-methoxypropionate, ethyl 3-ethoxypropionate or ethyl 2-ethoxypropionate; a (di)glycol dialkyl ester such as ethylene glycol dimethyl ether, diethylene glycol dimethyl ether, diethylene glycol diethyl ether, diethylene glycol methylethyl ether, propylene glycol dimethyl ether or dipropylene glycol dimethyl ether; a (di)glycol monoalkyl ether such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether or dipropylene glycol monoethyl ether; a glycol monoalkyl ether ester such as propylene glycol monomethyl ether acetate, carbitol acetate or ethyl cellosolve acetate; or a ketone such as cyclohexanone, methyl ethyl ketone, methyl isobutyl ketone or 2-heptanone. Such polymerization solvents may be used alone or in combination of two or more of them.

The number average molecular weight of the specific copolymer (alkali-soluble resin) to be used for the positive photosensitive resin composition of the present invention is preferably from 2,000 to 20,000, more preferably from 3,000 to 15,000, further more preferably from 3,000 to 10,000 as calculated as polystyrene. If the number average molecular weight is at most 2,000, the resulting pattern tends to have an undesirable profile, the retention of the pattern-film tends to decrease, and the heat resistance of the pattern tends to be poor. On the other hand, if the number average molecular weight is more than 20,000, the coating properties of the photosensitive resin composition tends to be poor, the developability tends to deteriorate, the pattern obtainable tends to have an undesirable profile, and the film tends to remain in a space of at most 50 μm in the pattern, and therefore the resolution will deteriorate.

Further, as the alkali-soluble resin contained in the positive photosensitive resin composition of the present invention, one having a low residual monomer ratio is preferably used. Here, the residual monomer is an unreacted residue of the respective monomer components to constitute the specific monomer, which remains after the above specific copolymer is prepared. The residual monomer ratio is the ratio of the total amount of the residual monomer components to the total amount of the monomer components used in the synthesis reaction of the specific copolymer, as represented by wt %. The residual monomer ratio can be confirmed, for example, by analyzing the reaction solution by means of e.g. liquid chromatography.

Specifically, the residual monomer ratio is preferably at most 2.5 wt %, more preferably at most 2.0 wt %, most preferably at most 1.5 wt %. If the residual monomer ratio exceeds 2.5 wt %, the electrical characteristics of the display devices tend to decrease.

The method for decreasing the residual monomer in the alkali-soluble resin is not particularly limited, but can be achieved, for example, by carrying out purification such as reprecipitation commonly known in a polymer organic synthesis, or by increasing the reaction temperature the final step of polymerization.

1,2-Quinone Diazide Compound

The 1,2-quinone diazide compound to be used for the positive photosensitive resin composition of the present invention is not particularly limited so long as it is one represented by the formula (1):

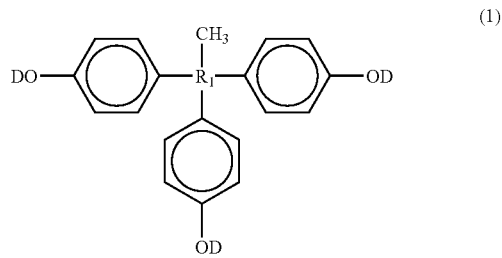

(wherein each D independently is a hydrogen atom or an organic group having a 1,2-quinone diazide group, $R_1$ is a tetravalent organic group, provided that at least one of D is an organic group having a 1,2-quinone diazide group). As a specific example, preferred from the viewpoint of sensitivity, resolution and transparency is a compound- represented by the following formula (3) or (4):

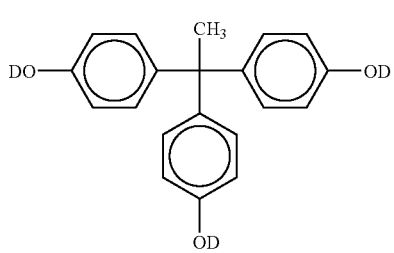

(3)

(wherein each D independently is a hydrogen atom or an organic group having a 1,2-quinone diazide group, provided that at least one of D is an organic group having a 1,2-quinone diazide group)

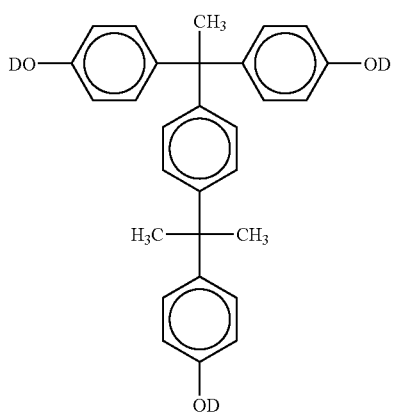

(4)

(wherein each D independently is a hydrogen atom or an organic group having a 1,2-quinone diazide group, provided that at least one of D is an organic group having a 1,2-quinone diazide group).

The content of the 1,2-quinone diazide compound in the positive photosensitive resin composition of the present invention is preferably from 5 to 100 parts by weight, more preferably from 10 to 50 parts by weight, most preferably from 10 to 30 parts by weight, per 100 parts by weight of the alkali-soluble resin component.

If the content of the 1,2-quinone diazide compound is less than 5 parts by weight per 100 parts by weight of the alkali-soluble resin component, the difference in the solubility in the developer between the exposed regions and the unexposed regions will be small, and therefore pattern formation (patterning) by development will be difficult. On the other hand, if the content exceeds 100 parts by weight, the 1,2-quinone diazide compound will not sufficiently be decomposed in a short-time exposure, and therefore the sensitivity tends to deteriorate.

Crosslinking Compound

The crosslinking compound to be used for the positive photosensitive resin composition of the present invention is not particularly limited so long as it is one represented by the formula (2):

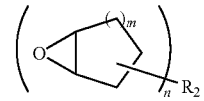

(2)

(wherein n is an integer of from 2 to 10, m is an integer of from 0 to 4, and $R_2$ is an n-valent organic group). As specific examples, epoxy resins having a cyclohexene oxide structure, such as EPOLEAD GT-401, EPOLEAD GT-403, EPOLEAD GT-301, EPOLEAD GT-302, CELLOXIDE 2021 and CELLOXIDE 3000 (manufactured by DAICEL CHEMICAL INDUSTRIES, LTD.); and alicyclic epoxy resins such as Denacol EX-252 (manufactured by Nagase ChemteX Corporation), CY175, CY177, CY179 (manufactured by CIBA-GEIGY A.G.), Araldit CY-182, Araldit CY-192, Araldit CY-184 (manufactured by CIBA-GEIGY A.G.), EPICLON 200, EPICLON 400 (manufactured by DAINIPPON INK AND CHEMICALS, INCORPORATED), Epicoat 871, Epicoat 872 (manufactured by Japan Epoxy Resins Co., Ltd.), ED-5661 and ED-5662 (manufactured by Celanese Chemicals, Ltd.) may be mentioned. Further, these crosslinking compounds may be used alone or in combination as a mixture of two or more of them.

Among them, from the viewpoint of the process resistance such as heat resistance, solvent resistance or long-time baking resistance and transparency, it is preferred to use an epoxy resin having cyclohexene oxide structures represented by the formula (2) wherein m is 2. Especially, it is preferred to use an epoxy resin having cyclohexene oxide structures represented by the formula (2) wherein n is an integer of from 3 to 10, and m is an integer of 2, particularly preferred to use an epoxy resin represented by the formula (5):

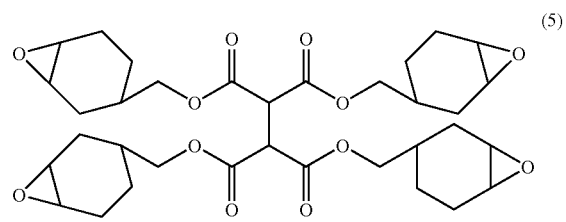

(5)

which corresponds to the formula (2) wherein n is 4, and m is 2.

The content of the crosslinking compound is preferably 5 to 50 parts by weight, more preferably from 10 to 40 parts by weight, further more preferably from 15 to 30 parts by weight, per 100 parts by weight of the alkali soluble resin component. If the content of the crosslinking compound is less than 5 parts by weight, the crosslinking density of a coating film obtainable by using the positive photosensitive resin composition will be insufficient, and therefore the process resistance such as heat resistance, solvent resistance or long-time baking resistance of the coating film after pattern formation will deteriorate. If the content of the crosslinking compound is at least 10 parts by weight, electrical characteristics of display devices will not deteriorate even when the residual monomer ratio exceeds 2.5 wt %. On the other hand, if the content exceeds 50 parts by weight, the crosslinking compound may partly remain uncrosslinked, and therefore the process resistance such as heat resistance, solvent resistance or long-time baking resistance of the coating film after pattern formation, will deteriorate, whereby the storage stability of the photosensitive resin composition will be poor.

Thus, with respect to the most preferred content of each component, for example, the positive photosensitive resin composition of the present invention contains the 1,2-quinone diazide compound in an amount of from 10 to 30 parts by weight, and the crosslinking compound having at least two epoxy groups in an amount of from 15 to 30 parts by weight, per 100 parts by weight of the alkali-soluble resin component.

Other Components which may be Contained

Needless to say, the positive photosensitive resin composition of the present invention preferably contains a surfactant for improving the coating properties. Such a surfactant may be a fluorine type surfactant, a silicone type surfactant, a nonionic surfactant or the like, and it is not particularly limited. However, a fluorine type surfactant is preferred in the effect of improving the coating properties. As specific examples of the fluorine type surfactant, EFTOP EF301, EF303, EF352 (manufactured by Tohkem Products Corporation); MEGAFACE F171, F173, R-30 (manufactured by DAINIPPON INK AND CHEMICALS, INCORPORATED); Fluorad FC430, FC431 (manufactured by SUMITOMO 3M Limited); Asahi Guard AG710, Surflon S-382, SC101, SC102, SC103, SC104, SC105 and SC106 (manufactured by Asahi Glass Company, Limited) may be mentioned, but it is not restricted thereto.

The content of the surfactant in the positive photosensitive resin composition of the present invention is preferably from 0.01 to 5 parts by weight, more preferably from 0.01 to 3 part by weight, most preferably from 0.01 to 2 part by weight, per 100 parts by weight of the alkali-soluble resin component. If the content of the surfactant is more than 5 parts by weight, the coating film tends to be uneven. If it is less than 0.01 part by weight, striations or the like tend to form on the coating film.

Needless to say, the positive photosensitive resin composition of the present invention preferably contains an adhesion promoter for improving the adhesion with a substrate after the development. Specific examples of such an adhesion promoter may be chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as vinyltrichlorosilane, γ-chloropropyltrimethoxysilane, γ-aminopropyltriethoxysilane, γ-methacryloxypropyltrimethoxysilane and γ-glycidoxypropyltrimethoxysilane; heterocyclic compounds such as benzotriazole, benzimidazole, indazole, imidazole, 2-mercaptobenzimidazole, 2-mercaptobenzthiazole, 2-mercaptobenzoxazole, urazole, thiouracil, mercaptoimidazole and mercaptopyrimidine; ureas such as 1,1-dimethylurea and 1,3-dimethylurea; and thiourea compounds.

Such adhesion promoters are usually used in a ratio of at most 20 parts by weight, preferably from 0.05 to 10 parts by weight, particularly preferably from 1 to 10 parts by weight, per 100 parts by weight of the alkali-soluble resin component.

The positive photosensitive resin composition of the present invention may also contain a pigment, a dye, a storage stabilizer or an antifoaming agent, as the case requires.

Positive Photosensitive Resin Composition

The positive photosensitive resin composition of the present invention can readily be prepared by mixing the above-mentioned respective components uniformly. The composition is usually used in the form of a solution in an appropriate solvent, and, for example, prepared in the form of a solution by dissolving an alkali-soluble resin in a solvent, and then mixing with the resulting solution, a 1,2-quinone diazide compound, a crosslinking compound, a surfactant and other components in the prescribed ratios, as the case requires. Such a solvent to be used in the present invention may, for example, be ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate or butyl lactate. Such organic solvents may be used alone or in combination as a mixture of two or more of them.

Further, a high boiling point solvent such as propylene glycol monobutyl ether, propylene glycol monobutyl ether acetate or the like can be mixed before use. Among these solvents, propylene glycol monomethyl ether, propylene glycol monomethyl ether acetate, ethyl lactate, butyl lactate and cyclohexanone are preferred for improving the leveling property.

When the positive photosensitive resin composition of the present invention is in the form of a solution, the solid content is not particularly limited so long as each component is dissolved uniformly. It is usually used at a solid content within a range of from 1 to 50 wt % in view of efficiency in processing. Further, the positive photosensitive resin composition solution prepared as described above is preferably used after filtrated through a filter having a pore size of approximately 0.5 μm or the like. The positive photosensitive resin composition solution thus prepared is also excellent in long-term storage stability at room temperature.

The positive photosensitive resin composition solution of the present invention is rotatively applied on a substrate such as a glass substrate, a silicon wafer, an oxide film or a nitride film, and then predried at from 80 to 130° C. for from 30 to 600 seconds, to form a coating film.

The coating film formed as described above is irradiated with light such as ultraviolet ray through a mask having a prescribed pattern, mounted thereon, and then developed with an alkaline developer, to wash off the exposed portions, leaving a relief pattern having a sharp edge surface. The developer to be used may be any aqueous alkaline solution, and an aqueous solution of an alkali metal hydroxide such as potassium hydroxide, sodium hydroxide, potassium carbonate or sodium carbonate; an aqueous solution of a quaternary ammonium hydroxide such as tetramethylammonium hydroxide, tetraethylammonium hydroxide or choline; or an aqueous solution of an amine such as ethanolamine, propylamine or ethylenediamine may, for example, be mentioned.

An aqueous solution as the alkaline developer usually has a concentration of at most 10 wt % and is preferably used at a concentration of from 0.1 to 3.0 wt %. The photosensitive resin composition of the present invention can be developed with from 0.4 to 2.38 wt % aqueous tetraethylammonium hydroxide solution usually used for photoresists, without problems such as swelling. Further, an alcohol or a surfactant may be added to the developer before use. Each of them may preferably be blended within a range of from 0.05 to 10 parts by weight per 100 parts by weight of the developer.

The development time is usually from 15 to 180 seconds, and the developing method may be any method, such as a loading or dipping method. After the development, the substrate is washed with flowing water for from 20 to 90 seconds, and then dried with compressed air or compressed nitrogen to remove moisture on the substrate, thereby to form a patterned coating film. Then, the patterned coating film is entirely irradiated with light by e.g. a high-pressure mercury-vapor lamp to completely decompose the 1,2-quinone diazide compound remaining in the patterned coating film, and then postbaked by means of a hotplate, an oven or the like, whereby a cured film having excellent heat resistance, transparency, planarization property, low water absorption and chemical resistance, and having a good relief pattern can be obtained. The postbaking may, for example, be carried out at a temperature of from 140 to 250° C., for from 5 to 30 minutes on a hotplate or for from 30 to 90 minutes on an oven.

EXAMPLES

Now, the present invention will be described in further detail with reference to Examples, but it should be understood that the present invention is by no means restricted thereto.

Preparation Example 1

Specific Copolymers (P1 to P4)

Using 13.5 g of methacrylic acid, 35.3 g of N-cyclohexylmaleimide, 25.5 g of hydroxyethyl methacrylate and 25.7 g of methyl methacrylate as monomer components to constitute specific copolymers, and using azobisisobutyronitrile as a radical polymerization initiator, they were reacted at from 60 to 100° C. in propylene glycol monomethyl ether acetate (hereinafter abbreviated as PGMEA) to obtain PGMEA solutions of the specific copolymers as follows.

The residual monomer ratio was measured by using liquid chromatography (LC2000 Plus system, manufactured by JASCO Corporation, column: ODS-2).

(P1): Number average molecular weight 4,100; residual monomer ratio 1.5 wt %

(P2): Number average molecular weight 9,500; residual monomer ratio 1.6 wt %

(P3): Number average molecular weight 4,200; residual monomer ratio 0.5 wt %

(P4): Number average molecular weight 4,300; residual monomer ratio 5.0 wt %

Preparation Example 2

Specific Copolymer (P5)

A cyclohexanone solution of a specific copolymer shown below was obtained in the same manner as in Preparation Example 1 by using cyclohexanone instead of PGMEA in Preparation Example 1.

(P5) : Number average molecular weight 4,500; residual monomer ratio 1.1 wt %

Preparation Example 3

Specific Copolymer (P6)

A PGMEA solution of a specific copolymer shown below was obtained in the same manner as in Preparation Example 1 by using 35.3 g of N-phenylmaleimide instead of 35.3 g of N-cyclohexylmaleimide in Preparation Example 1.

(P6): Number average molecular weight 5,100; residual monomer ratio 1.4 wt %

Preparation Example 4

Specific Copolymer (P7)

A PGMEA solution of a specific copolymer shown below was obtained in the same manner as Preparation Example 1 by using 25.5 g of hydroxybutyl methacrylate and 25.7 g of diethyl maleate instead of 25.5 g of hydroxyethyl methacrylate and 25.7 g of methyl methacrylate in Preparation Example 1.

(P7): Number average molecular weight 4,100; residual monomer ratio 1.3 wt %

Preparation Example 5

Specific Copolymer (P8)

A PGMEA solution of a specific copolymer shown below was obtained in the same manner as in Preparation Example 1 by using 9.0 g of methacrylic acid, 32.8 g of N-cyclohexylmaleimide, 25.4 g of hydroxyethyl methacrylate and 32.8 g of methyl methacrylate as monomer components to constitute the specific copolymer.

(P8) : Number average molecular weight 3,800; residual monomer ratio 1.6 wt %

Preparation Example 6

Copolymer (P9)

A PGMEA solution of a copolymer shown below was obtained in the same manner as in Preparation Example 1 by using 13.5 g of methacrylic acid, 25.5 g of hydroxyethyl methacrylate and 61.0 g of methyl methacrylate as monomer components to constitute the copolymer.

(P9) : Number average molecular weight 4,400; residual monomer ratio 1.4 wt %

Example 1

Respective Components of the Composition

Alkali-soluble Resin: Specific Copolymer (P1) Obtained in Preparation Example 1

1,2-Quinone diazide compound: A sensitizer produced by a condensation reaction of 2.5 mol of 1,2-naphthoquinone-2-diazide-5-sulfonyl chloride and 1 mol of a trisphenol represented by the following structure.

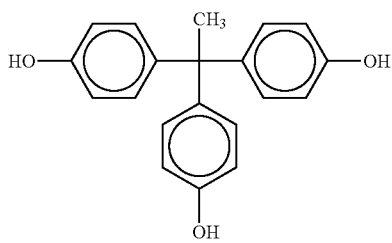

Crosslinking Compound: A compound of the following formula (5) having a four functional cyclohexene oxide structure.

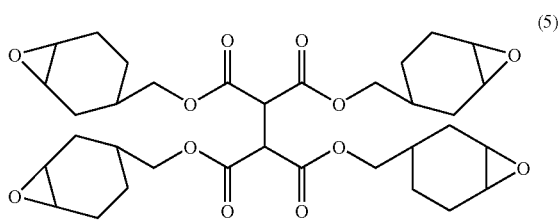

(5)

Preparation of Positive Photosensitive Resin Composition

To 82.1 g of an alkali-soluble resin solution prepared to a PGMEA solution having a resin concentration of 27%, 4.2 g of the 1,2-quinone diazide compound, 4.9 g of the crosslinking compound, and further 0.02 g of MEGAFACE R-30 (manufactured by DAINIPPON INK AND CHEMICALS, INCORPORATED) as a fluorine type surfactant and 1.0 g of γ-methacryloxypropyl trimethoxysilane as an adhesion promoter, were added, followed by stirring for an hour at room temperature to prepare a composition solution (1) as a positive photosensitive resin composition of the present invention. The viscosity of the composition solution (1) was 21.0 mPa·s. Further, no change in the viscosity was observed even after the composition solution (1) was left to stand for three months at room temperature.

Preparation of Cured Film

The composition solution (1) was applied on a silicon oxide-coated glass substrate by a spin coater, and then prebaked on a hotplate for 90 seconds at 115° C. to form a coating film having a thickness of 2.7 μm. The entire surface of the coating film obtained was irradiated with ultraviolet rays having a light intensity of 15 mW/cm$^2$ at 420 nm for 60 seconds (900 mJ/cm$^2$). After the irradiation with ultraviolet rays, the coating film was postbaked by heating at 230° C. for 30 minutes by using a hotplate to form a cured film having a thickness of 2.5 μm. The cured film thus formed was observed by an optical microscope, but no defects such as striations were found.

Evaluation of Process Resistance of Cured Film

Heat resistance: A cured film prepared in the same manner as described above was scratched from the substrate, and the heat resistance was evaluated by TG-DTA measurement. As a result, the thermal decomposition starting temperature was 270° C., and the 5% weight loss temperature was 330° C. Further, the glass transition temperature was at least 200° C.

Solvent resistance: 2.5 μm of a cured film was obtained in the same manner as described in the above Preparation of Cured Film by using a quartz substrate instead of the silicon oxide-coated glass substrate. Such a cured film was dipped at 60° C. for 20 minutes in each solution of monoethanolamine, N-methyl pyrrolidone, γ-butyl lactone, butyl cellosolve and 10% HCl, and the cured film was taken out from each solution and heated at 180° C. for 10 minutes on a hotplate. Transparency of the cured film obtained was analyzed at wavelengths of from 200 to 800 nm by using a UV-vis spectrometer, and the transmittance was found to be 95% at 400 nm, and was not decreased as compared with one before solvent treatment. Further, the thickness after the solvent treatment was about 2.5 μm, and no film decrease was observed.

Long-time baking resistance: 2.5 μm of a cured film was obtained in the same manner as described in the above Preparation of Cured Film by using a quartz substrate instead of the silicon oxide-coated glass substrate. The cured film was heated at 230° C. for 90 minutes, and then, its thickness was measured. As a result, the thickness was about 2.5 μm and no film shrinkage was observed.

Evaluation of Transparency of Cured Film 2.5 μm of a cured film was obtained in the same manner as described in the above Preparation of Cured Film by using a quartz substrate instead of a silicon oxide-coated glass substrate. The cured film was analyzed at wavelengths of from 200 to 800 nm by using a UV-vis spectrometer, and the transmittance was found to be 95% at 400 nm. Further, after heating at 230° C. for 90 minutes, the cured film was analyzed at wavelengths of from 200 to 800 nm by using a UV-vis spectrometer, and its transmittance was found to be 94% at 400 nm. After the composition solution was stored at room temperature for two months, the same evaluation was carried out, and as a result, no transmittance decrease was observed.

Evaluation of Reliability of Cured Film

A cured film prepared on a silicon oxide-coated glass substrate was scratched from the substrate in the same manner as described above, and 25 mg of the powder thus obtained was added to 1.5 g of nematic liquid crystal (manufactured by Merck Ltd., ZLI-2293). This mixture was heated at 100° C. for 24 hours, and the obtained mixture was filtrated through 0.45 μm of a filter to obtain sample liquid crystal for a reliability test. On the other hand, liquid crystal without adding the cured film was heated at 100° C. for 24 hours and used as comparative liquid crystal.

Using the above two types of liquid crystals, liquid crystal cells were prepared and their voltage holding ratios were compared. As a result, the voltage holding ratio of the sample liquid crystal for a reliability test was 98% at 23° C. and 89% at 80° C., and the voltage holding ratio of the comparative liquid crystal was 98% at 23° C. and 89% at 80° C., and thus showed equivalent values.

Here, the liquid crystal cell was prepared in such a manner that using two transparent electrode-coated substrates as one set, spacer particles of 6 μm were applied on the electrode surface of one substrate, and the two substrates were laminated so that the respective electrode surfaces faced inside, followed by injecting liquid crystal. Further, the voltage holding ratio was measured by using HR-1 voltage holding ratio measuring apparatus manufactured by TOYO TECHNICA Corporation by setting of Voltage: ±4 V, pulse width: 60 μs, flame period: 16.67 ms.

Evaluation of Photosensitive Properties

The composition solution (1) was applied on a silicon oxide-coated glass substrate by a spin coater, and then prebaked on a hotplate for 90 seconds at 115° C. to form a coating film having a thickness of 2.7 μm. The coating film was irradiated through a test mask with ultraviolet rays having a light intensity of 15 mW/cm² at 420 nm for 4 seconds (60 mJ/cm²) emitted by an ultraviolet irradiation apparatus model PLA-501 manufactured by Canon Inc., and then immersed in a from 0.2 to 2.38% TMAH aqueous solution for 80 seconds at 23° C. for development. Then, the substrate was washed with flowing ultrapure water for 20 seconds to form a positive pattern. After the development, the film thickness of the unexposed portion was approximately 2.7 μm, and no film reduction was observed.

Resolution: The pattern resolution was such that the pattern was formed up to line/space of 3 μm without peeling of the pattern. Then, the entire surface was irradiated with ultraviolet rays having a light intensity of 15 mW/cm² at 420 nm for 20 seconds (300 mJ/cm²), and the film was postbaked for 30 minutes at 230° C. to obtain a pattern having a thickness of 2.5 μm.

Sensitivity: In the above pattern formation, ultraviolet ray irradiation was carried out while changing the ultraviolet dose before development by 10 mJ/cm² at a time, and the minimum ultraviolet dose required to completely dissolve the exposed portion in the developer was measured, whereby the exposed portion completely dissolved at a dose of 40 mJ/cm². After the composition solution was stored for two months at room temperature, the same evaluation was carried out, and as a result, no sensitivity reduction was observed.

Example 2

A positive photosensitive resin composition was prepared and a composition solution (2) as a positive photosensitive resin composition of the present invention was obtained in the same manner as in Example 1 except that in Example 1, a sensitizer produced by a condensation reaction of 1 mol of trisphenol represented by the following structure and 2.0 mol of 1,2-naphthoquinone-2-diazide-5-sulfonyl chloride, was used as a 1,2-quinone diazide compound.

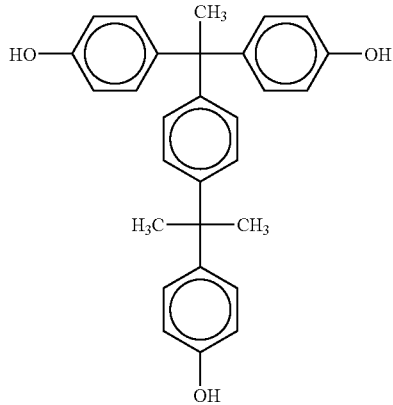

Using this composition solution (2), evaluations were carried out in the same manner as in Example 1.

Process Resistance of Cured Film

Heat resistance: Thermal decomposition starting temperature was 270° C., and the 5% weight loss temperature was 330° C. Further, the glass transition temperature was at least 200° C.

Solvent resistance: The transmittance was 96% at 400 nm, and no reduction from before the solvent treatment was observed. Further, the film thickness after the solvent treatment was about 2.5 μm, and no film reduction was observed.

Long-time baking resistance: No film shrinkage was observed.

Transparency of Cured Film

The transmittance was 96% at 400 nm. Further, after such a cured film was heated at 230° C. for 90 minutes, the transmittance was 95% at 400 nm. After the composition solution was stored at room temperature for two months, the same evaluation was carried out, and as a result, no reduction of the transmittance was observed.

Reliability of Cured Film

The voltage holding ratio of sample liquid crystal for a reliability test was 98% at 23° C. and 88% at 80° C., and was found to show equivalent values to the voltage holding ratio of the comparative liquid crystal.

Evaluation of Photosensitive Properties

Resolution: The pattern resolution was such that the pattern was formed up to a line/space of 3 lμm without peeling of the pattern. Then, the entire surface was irradiated with ultraviolet rays having a light intensity of 15 mW/cm² at 420 nm for 20 seconds (300 mJ/cm²), and the film was postbaked for 30 minutes at 230° C. to obtain a pattern having a thickness of 2.5 μm.

Sensitivity: The minimum ultraviolet dose required to completely dissolve the exposed portion in the developer was measured, whereby the exposed portion completely dissolved at a dose of 50 mJ/cm². After the composition solution was stored for two months at room temperature, the same evaluation was carried out, and as a result, no sensitivity reduction was observed.

Example 3

A positive photosensitive resin composition was prepared and a composition solution (3) as a positive photosensitive resin composition of the present invention was obtained in the same manner as in Example 1 except that in Example 1, the specific copolymer (P2) obtained in Preparation Example 1 was used as an alkali-soluble resin. Using this composition solution (3), evaluations were carried out in the same manner as in Example 1.

Process Resistance of Cured Film

Heat resistance: Thermal decomposition starting temperature was 270° C., and the 5% weight loss temperature was 330° C. Further, the glass transition temperature was at least 200° C.

Solvent resistance: The transmittance was 96% at 400 nm, and no reduction from before the solvent treatment was observed. Further, the film thickness after the solvent treatment was about 2.5 μm, and no film reduction was observed.

Long-time baking resistance: No film shrinkage was observed.

Transparency of Cured Film

The transmittance was 96% at 400 nm. Further, after the cured film was heated at 230° C. for 90 minutes, its transmittance was 96% at 400 nm. After the composition solution was stored for two months at room temperature, the same evaluation was carried out, and as a result, no reduction of the transmittance was observed.

Reliability of Cured Film

The voltage holding ratio of sample liquid crystal for a reliability test was 98% at 23° C and 88% at 80° C., and was found to show equivalent values to the voltage holding ratio of the comparative liquid crystal.

Photosensitive Properties

Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 μm.

Sensitivity: The minimum ultraviolet dose required to completely dissolve the exposed portion in the developer was measured, whereby the exposed portion completely dissolved at a dose of 45 mJ/cm$^2$. After the composition solution was stored for two months at room temperature, the same evaluation was carried out, and as a result, no reduction of the sensitivity was observed.

Example 4

A positive photosensitive resin composition was prepared and a composition solution (4) as a positive photosensitive resin composition of the present invention was obtained in the same manner as in Example 1 except that in Example 1, the specific copolymer (P3) obtained in Preparation Example 1 was used as an alkali-soluble resin. Using this composition solution (4), evaluations were carried out in the same manner as in Example 1.

Process Resistance of Cured Film

Heat resistance: Thermal decomposition starting temperature was 270° C., and the 5% weight loss temperature was 330° C. Further, the glass transition temperature was at least 200° C.

Solvent resistance: The transmittance was 96% at 400 nm, and no reduction from before the solvent treatment was observed. Further, the film thickness after the solvent treatment was about 2.5 μm, and no film reduction was observed.

Long-term baking resistance: No film shrinkage was observed.

Transparency of the Cured Film

The transmittance was 96% at 400 nm. Further, after the cured film was heated at 230° C. for 90 minutes, its transmittance was 96% at 400 nm. After the composition solution was stored for two months at room temperature, the same evaluation was carried out, and as a result, no reduction of the transmittance was observed.

Reliability of Cured Film

The voltage holding ratio of sample liquid crystal for a reliability test was 98% at 23° C. and 89% at 80° C., and was found to show equivalent values to the voltage holding ratio of the comparative liquid crystal.

Photosensitive Properties

Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$) and the film was postbaked for 30 minutes at 230° C. to obtain a pattern having a thickness of 2.5 μm.

Sensitivity: The minimum ultraviolet dose required to completely dissolve the exposed portion in the developer was measured, whereby the exposed portion completely dissolved at a dose of 40 mJ/cm$^2$. After the composition solution was stored for two months at room temperature, the same evaluation was carried out, and as a result, no reduction of the sensitivity was observed.

Example 5

A positive photosensitive resin composition was prepared and a composition solution (5) as a positive photosensitive resin composition of the present invention was obtained in the same manner as in Example 1 except that in Example 1, the specific copolymer (P3) obtained in Preparation Example 1 was used as an alkali-soluble resin and the crosslinking compound was added in an amount of 3.4 g. Using this composition solution (5), evaluations were carried out in the same manner as in Example 1.

Process Resistance of Cured Film

Heat resistance: Thermal decomposition starting temperature was 270° C., and the 5% weight loss temperature was 330° C. Further, the glass transition temperature was at least 200° C.

Solvent resistance: The transmittance was 96% at 400 nm, and no reduction from before the solvent treatment was observed. Further, the film thickness after the solvent treatment was about 2.5 μm, and no film reduction was observed.

Long-term baking resistance: No film shrinkage was observed.

Transparency of the Cured Film

The transmittance was 96% at 400 nm. Further, after the cured film was heated at 230° C. for 90 minutes, its transmittance was 95% at 400 nm. After the composition solution was stored for two months at room temperature, the same evaluation was carried out, and as a result, no reduction of the transmittance was observed.

Reliability of Cured Film

The voltage holding ratio of sample liquid crystal for a reliability test was 98% at 23° C. and 89% at 80° C., and was found to show equivalent values to the voltage holding ratio of the comparative liquid crystal.

Photosensitive Properties

Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 μm.

Sensitivity: The minimum ultraviolet dose required to completely dissolve the exposed portion in the developer was measured, whereby the exposed portion completely dissolved at a dose of 40 mJ/cm$^2$. After the composition solution was stored for two months at room temperature, the same evaluation was carried out, and as a result, no reduction of the sensitivity was observed.

Example 6

A positive photosensitive resin composition was prepared and a composition solution (6) as a positive photosensitive resin composition of the present invention was obtained in the same manner as in Example 1 except that in Example 1, the specific copolymer (P4) obtained in Preparation Example 1 was used as an alkali-soluble resin and the crosslinking compound was added in an amount of 3.4 g. Using this composition solution (6), evaluations were carried out in the same manner as in Example 1.

Process Resistance of Cured Film
Heat resistance: Thermal decomposition starting temperature was 270° C., and the 5% weight loss temperature was 330° C. Further, the glass transition temperature was at least 200° C.

Solvent Resistance
The transmittance was 95% at 400 nm, and no reduction from before the solvent treatment was observed. Further, the film thickness after the solvent treatment was about 2.5 Jμm, and no film reduction was observed.
Long-time baking resistance: No film shrinkage was observed.

Transparency of Cured Film
The transmittance was 95% at 400 nm. Further, after the cured film was heated at 230° C. for 90 minutes, its transmittance was 94% at 400 nm. After the composition solution was stored for two months at room temperature, the same evaluation was carried out, and as a result, no reduction of the transmittance was observed.

Reliability of Cured Film
The voltage holding ratio of sample liquid crystal for a reliability test was 97% at 23° C. and 84% at 80° C., and was found to show equivalent values to the voltage holding ratio of the comparative liquid crystal.

Photosensitive Properties
Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 μm.
Sensitivity: The minimum ultraviolet dose required to completely dissolve the exposed portion in the developer was measured, whereby the exposed portion completely dissolved at a dose of 40 mJ/cm$^2$. After the composition solution was stored for two months at room temperature, the same evaluation was carried out, and as a result, no reduction of the sensitivity was observed.

Example 7

A positive photosensitive resin composition was prepared and a composition solution (7) as a positive photosensitive resin composition of the present invention is was obtained in the same manner as in Example 1 except that in Example 1, the specific copolymer (P5) obtained in Preparation Example 2 was used as an alkali-soluble resin. Using this composition solution (7), evaluatations were carried out in the same manner as in Example 1.

Process Resistance of Cured Film
Heat resistance: Thermal decomposition starting temperature was 270° C., and the 5% weight loss temperature was 330° C. Further, the glass transition temperature was at least 200° C.
Solvent resistance: The transmittance was 96% at 400 nm, and no reduction from before the solvent treatment was observed. Further, the film thickness after the solvent treatment was about 2.5 μm, and no film reduction was observed.
Long-time baking resistance: No film shrinkage was observed.

Transparency of Cured Film
The transmittance was 96% at 400 nm. Further, after the cured film was heated at 230° C. for 90 minutes, its transmittance was 95% at 400 nm. After the composition solution was stored for two months at room temperature, the same evaluation was carried out, and as a result, no reduction of the transmittance was observed.

Reliability of Cured Film
The voltage holding ratio of sample liquid crystal for a reliability test was 98% at 23○C and 89% at 80° C., and was found to show equivalent values to the voltage holding ratio of the comparative liquid crystal.

Photosensitive Properties
Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 μm.
Sensitivity: The minimum ultraviolet dose required to completely dissolve the exposed portion in the developer was measured, whereby the exposed portion completely dissolved at a dose of 40 mJ/cm$^2$. After the composition solution was stored for two months at room temperature, the same evaluation was carried out, and as a result, no reduction of the sensitivity was observed.

Example 8

A positive photosensitive resin composition was prepared and a composition solution (8) as a positive photosensitive resin composition of the present invention was prepared in the same manner as in Example 1 except that in Example 1, the specific copolymer (P6) obtained in Preparation Example 3 was used as an alkali-soluble resin. Using this composition solution (8), evaluatations were carried out in the same manner as in Example 1.

Process Resistance of Cured Film
Heat resistance: Thermal decomposition starting temperature was 270° C., and the 5% weight loss temperature was 335° C. Further, the glass transition temperature was at least 200° C.
Solvent resistance: The transmittance was 95% at 400 nm, and no reduction from before the solvent treatment was observed. Further, the film thickness after the solvent treatment was about 2.5 μm, and no film reduction was observed.
Long-time baking resistance: No film shrinkage was observed.

Transparency of Cured Film
The transmittance was 95% at 400 nm. Further, after the cured film was heated at 230° C. for 90 minutes, its transmittance was 94% at 400 nm. After the composition solution was stored for two months at room temperature, the same evaluation was carried out, and as a result, no reduction of the transmittance was observed.

Reliability of Cured Film
The voltage holding ratio of sample liquid crystal for a reliability test was 97% at 23° C. and 88% at 80° C., and was found to show equivalent values to the voltage holding ratio of the comparative liquid crystal.

Photosensitive Properties
Resolution: The pattern resolution was such that the pattern was formed up to a line/space of 3 μm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 µm.

Sensitivity: The minimum ultraviolet dose required to completely dissolve the exposed portion in the developer was measured, whereby the exposed portion completely dissolved at a dose of 40 mJ/cm$^2$. After the composition solution was stored for two months at room temperature, the same evaluation was carried out, and as a result, no reduction of the sensitivity was observed.

Example 9

A positive photosensitive resin composition was prepared and a composition solution (9) as a positive photosensitive resin composition of the present invention was obtained in the same manner as in Example 1 except that in Example 1, the specific copolymer (P7) obtained in Preparation Example 4 was used as an alkali-soluble resin. Using this composition solution (9), evaluations were carried out in the same manner as in Example 1.

Process Resistance of Cured Film

Heat resistance: Thermal decomposition starting temperature was 265° C., and the 5% weight loss temperature was 325° C. Further, the glass transition temperature was at least 200° C.

Solvent resistance: The transmittance was 95% at 400 nm, and no reduction from before the solvent treatment was observed. Further, the film thickness after the solvent treatment was about 2.5 µm, and no film reduction was observed.

Long-time baking resistance: No film shrinkage was observed.

Transparency of Cured Film

The transmittance was 95% at 400 nm. Further, after the cured film was heated at 230° C. for 90 minutes, the transmittance was 94% at 400 nm. After the composition solution was stored for two months at room temperature, the same evaluation was carried out, and as a result, no reduction of the transmittance was observed.

Reliability of Cured Film

The voltage holding ratio of sample liquid crystal for a reliability test was 98% at 23° C. and 88% at 80° C., and was found to show equivalent values to the voltage holding ratio of the comparative liquid crystal.

Photosensitive Properties

Resolution: The pattern resolution was such that the pattern was formed up to a line/space of 3 µm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 µm.

Sensitivity: The minimum ultraviolet dose required to completely dissolve the exposed portion in the developer was measured, whereby the exposed portion completely dissolved at a dose of 45 mJ/cm$^2$. After the composition solution was stored for two months at room temperature, the same evaluation was carried out, and as a result, no reduction of the sensitivity was observed.

Example 10

A positive photosensitive resin composition was prepared and a composition solution (10) as a positive photosensitive resin composition of the present invention was obtained in the same manner as in Example 1 except that in Example 1, the specific copolymer (P8) obtained in Preparation Example 5 was used as an alkali-soluble resin. Using this composition solution (10), evaluations were carried out in the same manner as in Example 1.

Process Resistance of Cured Film

Heat resistance: Thermal decomposition starting temperature was 270° C., and the 5% weight loss temperature was 310° C. Further, the glass transition temperature was at least 200° C.

Solvent resistance: The transmittance was 95% at 400 nm, and no reduction from before the solvent treatment was observed. Further, the film thickness after the solvent treatment was about 2.5 µm, and no film reduction was observed.

Long-time baking resistance: No film shrinkage was observed.

Transparency of Cured Film

The transmittance was 95% at 400 nm. Further, after the cured film was heated at 230° C. for 90 minutes, the transmittance was 94% at 400 nm. After the composition solution was stored for two months at room temperature, the same evaluation was carried out, and as a result, no reduction of the transmittance was observed.

Reliability of Cured Film

The voltage holding ratio of sample liquid crystal for a reliability test was 98% at 23° C. and 88% at 80° C., and was found to show equivalent values to the voltage holding ratio of the comparative liquid crystal.

Photosensitive Properties

Resolution: The pattern resolution was such that the pattern was formed up to a line/space of 3 µm without peeling of the pattern. Then, the entire surface was irradiated with ultraviolet rays having a light intensity of 15 mW/cm$^2$ at 420 nm for 20 seconds (300 mJ/cm$^2$), and the film was postbaked for 30 minutes at 230° C. to obtain a pattern having a thickness of 2.5 µm.

Sensitivity: The minimum ultraviolet dose required to completely dissolve the exposed portion in the developer was measured, whereby the exposed portion completely dissolved at a dose of 45 mJ/cm$^2$. After the composition solution was stored for two months at room temperature, the same evaluation was carried out, and as a result, no sensitivity reduction was observed.

Comparative Example 1

A positive photosensitive resin composition was prepared and a composition solution (9) as a positive photosensitive resin composition was obtained in the same manner as in Example 1 except that in Example 1, the copolymer (P9) obtained in Preparation Example 6 was used as an alkali-soluble resin. Using this composition solution (9), evaluations were carried out in the same manner as in Example 1.

As a result, in the evaluation of the process resistance of the cured film, the 5% weight loss temperature was 290° C., which indicates inadequate heat resistance.

Comparative Example 2

A positive photosensitive resin composition was prepared and a composition solution (10) as a positive photosensitive resin composition was obtained in the same manner as in Example 1 except that in Example 1, the specific copolymer (P4) obtained in Preparation Example 1 was used as an alkali-soluble resin and the crosslinking compound was added in an amount of 1.0 g. Using this composition solution (10), evaluations were carried out in the same manner as in Example 1.

As a result, in the evaluation of the process resistance of the cured film, the transmittance reduction and the thickness reduction were observed with the film after the solvent treatment. Especially, in the case of using monoethanolamine, the transmittance was changed from 95% to 89% at 400 nm, and the thickness was changed from 2.5 μm to 2.3 lμm. Further, in the evaluation of the long-time baking resistance, such a film was heated at 230° C. for 90 minutes. As a result, the thickness was changed from 2.5 lμm to 2.2 μm, and film shrinkage was observed. Further, in the reliability evaluation, the voltage holding ratio of the sample liquid crystal for a reliability test was 85% at 23° C. and 60% at 80° C., and was found to show drastically lower values than those of the comparative liquid crystal.

Comparative Example 3

A composition solution (11) as a positive photosensitive resin composition was obtained in the same manner as in Example 1 except that in Example 1, a sensitizer produced by a condensation reaction of 1 mol of a trisphenol represented by the following structure and 3.0 mol of 1,2-naphthoquinone-2-diazide-5-sulfonyl chloride, was used as a 1,2-quinone diazide compound.

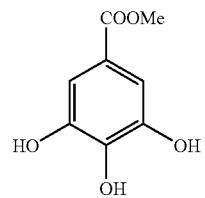

Using this composition solution (11), evaluations were carried out in the same manner as in Example 1.

As a result, in the evaluation of the transparency, the cured film obtained was analyzed at wavelengths of from 200 to 800 nm by using a UV-vis spectrometer, and the transmittance was found to be low i.e. 89% at 400 nm. Further, after heating at 230° C. for 90 minuets, such a cured film-was analyzed at wavelengths of from 200 to 800 nm by using a UV-vis spectrometer, and the transmittance was 80% at 400 nm.

Comparative Example 4

A composition solution (12) as a positive photosensitive resin composition was obtained in the same manner as in Example 1 except that in Example 1, hexamethoxymethylol melamine was used as a crosslinking compound. Using this composition solution (12), evaluations were carried out in the same manner as in Example 1.

As a result, in the evaluation of the process resistance of the cured film, the 5% weight loss temperature was 290° C., which indicates inadequate heat resistance. Further, in the evaluation of the transparency, the transmittance was found to be low i.e. 88% at 400 nm. Further, after heating at 230° C. for 90 minutes, such a cured film was analyzed at wavelengths of from 200 to 800 nm by using a UV-vis spectrometer, and the transmittance was found to be 79% at 400 nm.

INDUSTRIAL APPLICABILITY

The positive photosensitive resin composition of the present invention can form a cured film which requires pattern formation and which is required to have various properties such as a planarization property, heat resistance, solvent resistance, long-time baking resistance and high transparency.

The positive photosensitive resin composition of the present invention is suitable as a material for forming an electrode overcoating, a planarization film, an insulation film or the like in a display such as a thin film transistor (TFT) liquid crystal display device or an organic EL device. Particularly, such a positive photosensitive resin composition is suitable as a material for forming an interlayer insulation film for a TFT, a protective or planarization film for a color filter, an uneven film under a reflection film of a reflective display, a microlens material, an insulation film in an organic EL devices.

The invention claimed is:

1. A positive photosensitive resin composition comprising (A), (B) and (C);
   wherein (A) comprises an alkali-soluble resin comprising a copolymer comprising an unsaturated carboxylic acid derivative and an N-substituted maleimide selected from N-cyclohexylmaleimide, N-methylmaleimide and N-ethylmaleimide, and which has a number average molecular weight of from 2,000 to 20,000,
   wherein (B) comprises a 1,2-quinone diazide compound of formula (1):

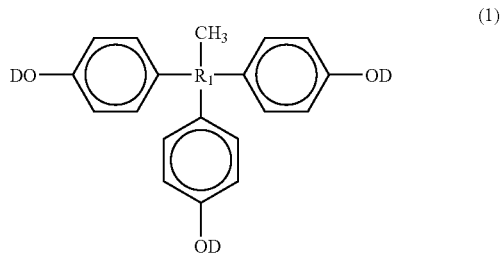

wherein each D independently is a hydrogen atom or an organic group comprising a 1,2-quinone diazide group, wherein $R_1$ is a tetravalent organic group, provided that at least one of D is an organic group comprising a 1,2-quinone diazide group, and
   wherein (C) comprises a crosslinking compound represented by formula (2), which is present in from 5 to 50 parts by weight, per 100 parts by weight of the alkali-soluble resin,

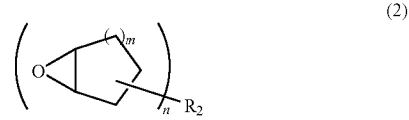

wherein n is an integer of from 2 to 10, m is an integer of from 0 to 4, and $R_2$ is an n-valent organic group.

2. The positive photosensitive resin composition of claim 1, wherein the alkali-soluble resin comprises a residual monomer ratio of at most 2.5 wt %.

3. The positive photosensitive resin composition of claim 1, comprising the 1,2-quinone diazide compound in an amount of from 5 to 100 parts by weight, per 100 parts by weight of the alkali-soluble resin.

4. The positive photosensitive resin composition of claim 1, wherein the 1,2-quinone diazide compound is a compound of formula (3):

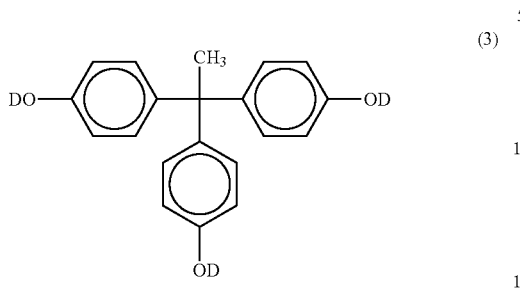

(3)

wherein each D independently is a hydrogen atom or an organic group comprising a 1,2-quinone diazide group, provided that at least one of D is an organic group comprising a 1,2-quinone diazide group.

5. The positive photosensitive resin composition of claim 1, wherein the 1,2-quinone diazide compound is a compound of formula (4):

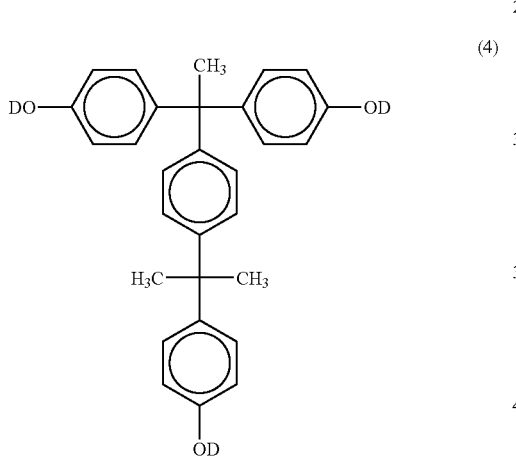

(4)

wherein each D independently is a hydrogen atom or an organic group comprising a 1,2-quinone diazide group, provided that at least one of D is an organic group comprising a 1,2-quinone diazide group.

6. The positive photosensitive resin composition of claim 1, wherein the alkali-soluble resin does not comprise an epoxy group.

7. The positive photosensitive resin composition of claim 1, wherein n is an integer of from 3 to 10, and m is an integer of 2, in the crosslinking compound of formula (2).

8. The positive photosensitive resin composition of claim 1, further comprising a surfactant in an amount of from 0.01 to 5 parts by weight per 100 parts by weight of the alkali-soluble resin.

9. The positive photosensitive resin composition of claim 1, wherein the positive photosensitive resin composition is a solution comprising a solid content concentration of from 1 to 50 wt %.

10. The positive photosensitive resin composition of claim 2, comprising the 1,2-quinone diazide compound in an amount of from 5 to 100 parts by weight, per 100 parts by weight of the alkali-soluble resin.

11. The positive photosensitive resin composition of claim 2, wherein the 1,2-quinone diazide compound is a compound of formula (3):

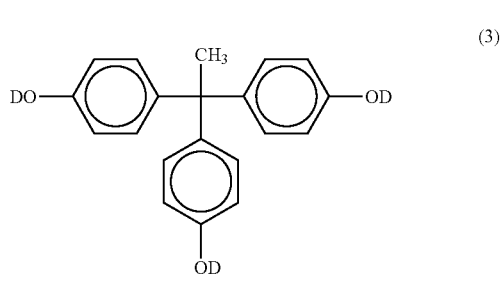

(3)

wherein each D independently is a hydrogen atom or an organic group comprising a 1,2-quinone diazide group, provided that at least one of D is an organic group comprising a 1,2-quinone diazide group.

12. The positive photosensitive resin composition of claim 3, wherein the 1,2-quinone diazide compound is a compound of formula (3):

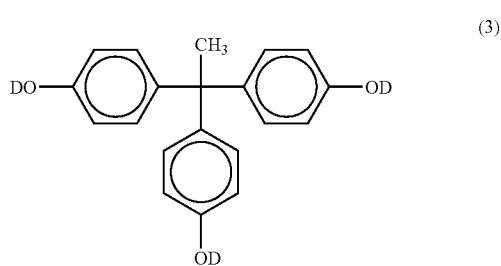

(3)

wherein each D independently is a hydrogen atom or an organic group comprising a 1,2-quinone diazide group, provided that at least one of D is an organic group comprising a 1,2-quinone diazide group.

13. The positive photosensitive resin composition of claim 2, wherein the 1,2-quinone diazide compound is a compound of formula (4):

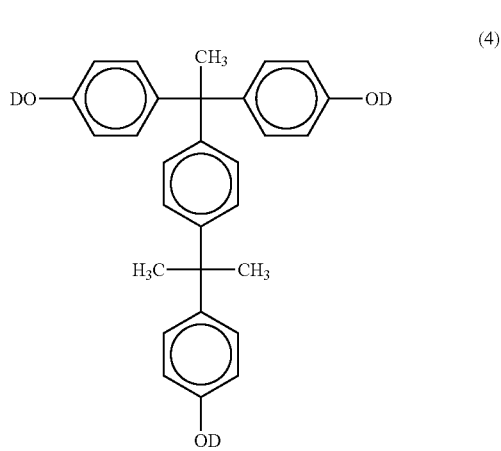

(4)

wherein each D independently is a hydrogen atom or an organic group comprising a 1,2-quinone diazide group, provided that at least one of D is an organic group comprising a 1,2-quinone diazide group.

14. The positive photosensitive resin composition of claim 3, wherein the 1,2-quinone diazide compound is a compound of formula (4):

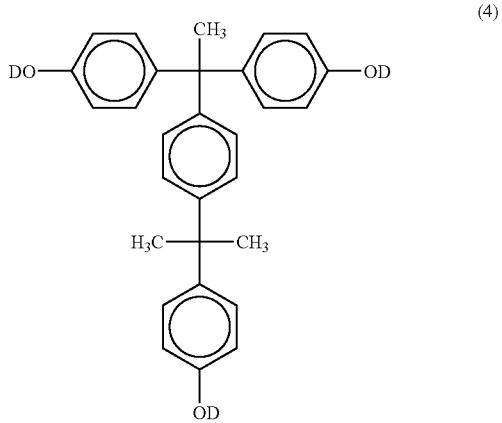

(4)

wherein each D independently is a hydrogen atom or an organic group comprising a 1,2-quinone diazide group, provided that at least one of D is an organic group comprising a 1,2-quinone diazide group.

15. The positive photosensitive resin composition of claim 2, wherein n is an integer of from 3 to 10, and m is an integer of 2, in the crosslinking compound of formula (2).

16. The positive photosensitive resin composition of claim 3, wherein n is an integer of from 3 to 10, and m is an integer of 2, in the crosslinking compound of formula (2).

17. The positive photosensitive resin composition of claim 4, wherein n is an integer of from 3 to 10, and m is an integer of 2, in the crosslinking compound of formula (2).

18. The positive photosensitive resin composition of claim 5, wherein n is an integer of from 3 to 10, and m is an integer of 2, in the crosslinking compound of formula (2).

19. The positive photosensitive resin composition of claim 2, further comprising a surfactant in an amount of from 0.01 to 5 parts by weight per 100 parts by weight of the alkali-soluble resin.

20. The positive photosensitive resin composition of claim 3, further comprising a surfactant in an amount of from 0.01 to 5 parts by weight per 100 parts by weight of the alkali-soluble resin.

* * * * *